United States Patent
Kim et al.

(10) Patent No.: US 8,098,518 B2
(45) Date of Patent: Jan. 17, 2012

(54) NONVOLATILE MEMORY DEVICE USING VARIABLE RESISTIVE ELEMENT

(75) Inventors: Hye-Jin Kim, Seoul (KR); Byung-Gil Choi, Gyeonggi-do (KR); Du-Eung Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 415 days.

(21) Appl. No.: 12/476,875

(22) Filed: Jun. 2, 2009

(65) Prior Publication Data

US 2009/0296459 A1 Dec. 3, 2009

(30) Foreign Application Priority Data

Jun. 3, 2008 (KR) .................. 10-2008-0052281

(51) Int. Cl.
*G11C 11/00* (2006.01)
(52) U.S. Cl. ...................................... 365/163; 365/148
(58) Field of Classification Search .................. 365/163, 365/148, 189.07, 189.09, 230.06
See application file for complete search history.

(56) References Cited

U.S. PATENT DOCUMENTS

| | | | | |
|---|---|---|---|---|
| 6,466,508 B1* | 10/2002 | Miyawaki et al. | ....... | 365/230.03 |
| 6,944,048 B2* | 9/2005 | Iwata | ............... | 365/158 |
| 7,830,699 B2* | 11/2010 | Choi et al. | .................... | 365/148 |
| 2010/0124097 A1* | 5/2010 | Takase | ........................ | 365/148 |

FOREIGN PATENT DOCUMENTS

| | | |
|---|---|---|
| JP | 2004-110978 | 4/2004 |
| JP | 2006-164407 | 6/2006 |
| KR | 97-51367 | 7/1997 |
| KR | 1020020095876 | 12/2002 |

\* cited by examiner

*Primary Examiner* — Anh Phung
(74) *Attorney, Agent, or Firm* — Myers Bigel Sibley & Sajovec, P.A.

(57) ABSTRACT

A nonvolatile memory device may include a memory cell array with a plurality of nonvolatile memory cells arranged in an array of rows and columns. Each of a plurality of bit lines may be coupled to nonvolatile memory cells in a respective one of the columns of the array, and each of a plurality of column selection switches may be coupled to a respective one of the bit lines. A column decoder may be coupled to the plurality of column selection switches, and the column decoder may be configured to select a first one of the bit lines using a first column selection signal having a first signal level applied to a first one of the column selection switches. The column decoder may be further configured to select a second one of the bit lines using a second column selection signal having a second signal level applied to a second one of the column selection switches with the second signal level being different than the first signal level.

20 Claims, 8 Drawing Sheets

NONVOLATILE MEMORY DEVICE USING VARIABLE RESISTIVE ELEMENT

RELATED APPLICATION

This application claims priority from Korean Patent Application No. 10-2008-0052281 filed on Jun. 3, 2008 in the Korean Intellectual Property Office, the disclosure of which is incorporated herein by reference in its entirety.

BACKGROUND OF THE INVENTION

1. Field of the Invention

The present invention relates to nonvolatile memory devices.

2. Description of the Related Art

Nonvolatile memory devices using resistive elements include phase-change random access memory (PRAM) devices, resistive random access memory (RRAM) devices, and magnetic random access memory (MRAM) devices. Nonvolatile memory devices store data using a variation in the state of a phase-change material such as a chalcogenide alloy, using a variation in the resistance of a variable resistive element, or using a variation in the resistance of magnetic tunnel junction (MTJ) films caused by a variation in the magnetic state of a ferroelectric material. In contrast, dynamic random access memory (DRAM) devices or flash memory devices store data using electric charge.

A phase-change material becomes either crystalline or amorphous by being heated and then cooled. A phase-change material in a crystalline state has a relatively high resistance, whereas a phase-change material in an amorphous state has a relatively low resistance. Thus, a phase-change material in a crystalline state may be defined as set data or data [0] and a phase-change material in an amorphous phase may be defined as reset data or data [1].

SUMMARY

According to some embodiments of the present invention, a nonvolatile memory device may include a memory cell array with a plurality of nonvolatile memory cells arranged in an array of rows and columns. Each of a plurality of bit lines may be coupled to nonvolatile memory cells in a respective one of the columns of the array, and each of a plurality of column selection switches may be coupled to a respective one of the bit lines. A column decoder may be coupled to the plurality of column selection switches, and the column decoder may be configured to select a first one of the bit lines using a first column selection signal having a first signal level applied to a first one of the column selection switches. The column decoder may be further configured to select a second one of the bit lines using a second column selection signal having a second signal level applied to a second one of the column selection switches with the second signal level being different than the first signal level.

According to other embodiments of the present invention, a nonvolatile memory device may include a memory cell array with a plurality of nonvolatile memory cells arranged in an array of rows and columns. Each of a plurality of word lines may be coupled to nonvolatile memory cells in a respective one of the rows of the array, and each of a plurality of bit lines may be coupled to nonvolatile memory cells in a respective one of the columns of the array. A column selection circuit may include a plurality of column selection switches, and each of the plurality of column selection switches may be coupled to a respective one of the bit lines. A column decoder may be coupled to the column selection circuit. The column decoder may be configured to apply a first column selection signal having a first signal level to a first one of the column selection switches in response to a first column address and to apply a second column selection signal having a second signal level to a second one of the column selection switches in response to a second column address. The first column address may identify a first one of the bit lines coupled to the first selection switch, the second column address may identify a second one of the bit lines coupled to the second selection switch, and the first and second signal levels may be different.

Embodiments of the present invention may provide a non-volatile memory device having improved write/read performance. The above and other aspects, features and advantages of the present invention will become more apparent to one of ordinary skill in the art to which the present invention pertains by referencing a detailed description of the present invention given below.

According to some embodiments of the present invention, a nonvolatile memory device may include a memory cell array having a matrix of a plurality of nonvolatile memory cells, a plurality of bit lines respectively coupled to a plurality of columns of the matrix, and a plurality of column selection switches which are respectively coupled to the bit lines. The plurality of column selection switches may choose the bit lines in response to a plurality of column selection signals, and at least two of the column selection signals may have different levels.

According to other embodiments of the present invention, a nonvolatile memory device may include a memory cell array having a matrix of a plurality of nonvolatile memory cells, a plurality of word lines respectively coupled to a plurality of rows of the matrix and a plurality of bit lines respectively coupled to a plurality of columns of the matrix. A column selection circuit may choose at least one of the bit lines in response to a column selection signal. A column decoder may provide the column selection signal to the column selection circuit, and a level of the column selection circuit may be determined by a column address.

BRIEF DESCRIPTION OF THE DRAWINGS

The above and other aspects and features of the present invention will become more apparent by describing in detail examples of embodiments thereof with reference to the attached drawings, in which.

DETAILED DESCRIPTION

The present invention will now be described more fully with reference to the accompanying drawings, in which embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
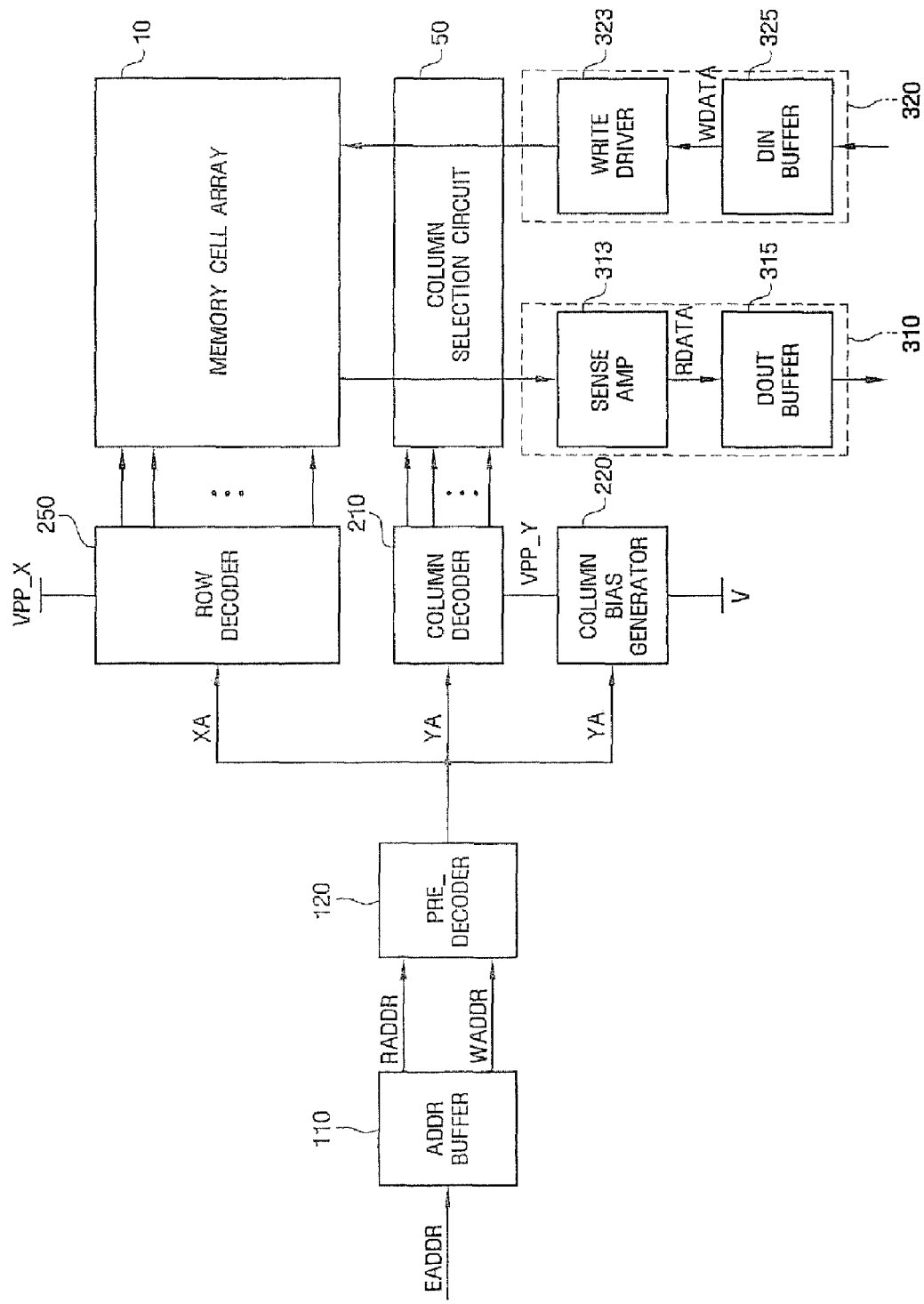
FIG. 1 is a block diagram of a nonvolatile memory device according to some embodiments of the present invention.
Figure 2:
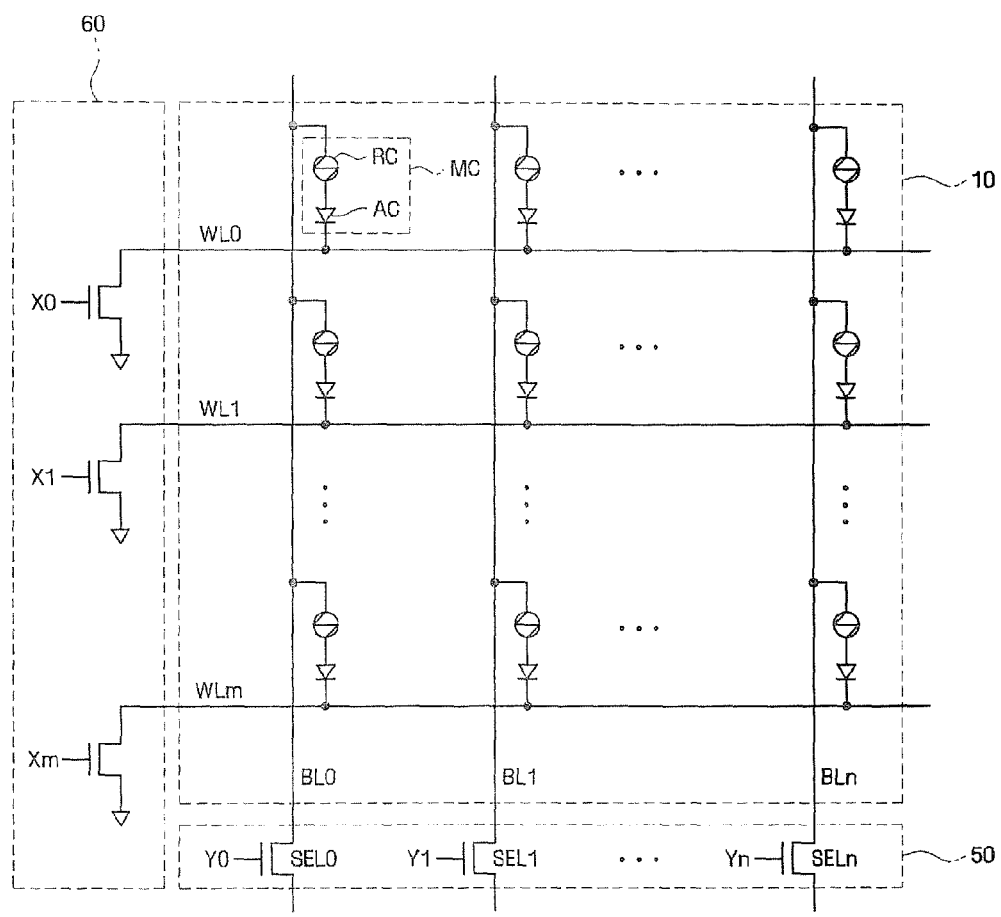
FIG. 2 is a circuit diagram of a memory cell array shown in FIG. 1 and other elements coupled to the memory cell array.

FIG. 1 is a block diagram of a nonvolatile memory device according to some embodiments of the present invention, and FIG. 2 is a circuit diagram of a memory cell array 10 shown in FIG. 1 and other elements coupled to the memory cell array 10.

Referring to FIGS. 1 and 2, the nonvolatile memory device includes the memory cell array 10, a column selection circuit 50, a column decoder 210, a column bias generation module 220, a row decoder 250, a pre-decoder 120, an address buffer 110, a read circuit 310, and a write circuit 320.

The memory cell array 10 includes a matrix of a plurality of nonvolatile memory cells MC arranged in rows and columns. A plurality of rows of memory cells of the matrix are respectively coupled to a plurality of word lines WL0 through WLm, and a plurality of columns of the matrix are respectively coupled to a plurality of bit lines BL0 through BLn.

Each of the nonvolatile memory cells MC may include a variable resistive element RC having a phase-change material with resistance that varies according to whether the state of the phase-change material is a crystalline state or an amorphous state; and an access element AC controlling a current that flows in the variable resistive element RC. The access element AC of each of the nonvolatile memory cells MC may be a diode or a transistor coupled in series with the variable resistive element RC of a corresponding nonvolatile memory cell MC. The access element AC of each of the nonvolatile memory cells MC is illustrated in FIG. 2 as being a diode, but embodiments of the present invention are not restricted to diodes. A phase-change random access memory (PRAM) cell having a diode as an access element may be referred to as a diode-controlled PRAM cell. The phase change material of the variable resistive element RC of each of the nonvolatile memory cells MC may be a binary compound such as GaSb, InSb, InSe, $Sb_2Te_3$ or GeTe; a ternary compound such as GeSbTe, GaSeTe, InSbTe, $SnSb_2Te_4$, or InSbGe; or a quaternary compound such as AgInSbTe, (GeSn)SbTe, GeSb (SeTe), or $Te_{81}Ge_{15}Sb_2S_2$. According to some embodiments of the present invention, the phase change material of the variable resistive element RC of each of the nonvolatile memory cells MC may be GeSbTe.

Each of the word lines WL0 through WLm may have a hierarchical word line architecture by including a main word line and a sub-word line to meet demand for increasing capacity and integration density of nonvolatile memory devices.

The column selection circuit 50 may choose one of the bit lines BL0 through BLn (for example, the bit line BL0) and may couple the write circuit 320 and/or the read circuit 310 to the chosen bit line BL0. The column selection circuit 50 may include a plurality of column selection switches SEL0 through SELn. The column selection switches SEL0 through SELn may be coupled to the bit lines BL0 through BLn, respectively, and may choose at least one of bit lines BL0 through BLn in response to a plurality of column selection signals Y0 through Yn. The column selection signals Y0 through Yn may not necessarily have the same turn-on levels. At least two of the column selection signals Y0 through Yn may have different turn-on levels.

For example, the column selection signal Y0, which has a first turn-on level, may be applied to the first column selection switch SEL0, and the column selection signal Y3, which has a second turn-on level, may be applied to the second column selection switch SEL3.

Alternatively, the column selection switches SEL0 through SELn may be classified into one or more column selection switch groups, and column selection signals having the same turn-on level may be applied to a number of column selection switches SEL0 through SELn classified into the same column selection switch group. At least two of the column selection switch groups may differ from each other in terms of the turn-on level of column selection signals applied thereto. For example, column selection signals Y0 through Y3 having the first turn-on level may be applied to a first column selection switch group including the column selection switches SEL0 through SEL3, and column selection signals Y4 through Y7 having the second turn-on level may be applied to a second column selection switch group including the column selection switches SEL4 through SEL7.

The column decoder 210 is provided with a column bias VPP_Y by the column bias generation module 220 and is provided with a column address YA by the pre-decoder 120. Then, the column decoder 210 provides the column selection signals Y0 through Yn to the column selection circuit 50. More particularly, the column decoder 210 may provide the column selection signals Y0 through Yn, which may have at least two different turn-on levels, to the column selection circuit 50 using the column address YA. Once one of the bit lines BL0 through BLn and one of the word lines WL0 through WLm are chosen according to the column address YA, the turn-on levels of the column selection signals Y0 through Yn may be determined based on a distance between the chosen bit line and a strapping node of the chosen word line as described later in further detail with reference to FIGS. 3 through 5.

The column bias generation module 220 provides the column bias VPP_Y, which may have at least two different turn-on signal (e.g., voltage) levels, to the column decoder 210 in response to the column address YA provided by the pre-decoder 120. The level of the column bias VPP_Y, like the levels of the column selection signals Y0 through Yn, may be determined in the same manner as the turn-on levels of the column selection signals Y0 through Yn. That is, Once one of the bit lines BL0 through BLn and one of the word lines WL0 through WLm are chosen according to the column address YA, the level of the column bias VPP_Y may be determined based on a distance between the chosen bit line and a strapping node of the chosen word line. The structure and the operation of the column bias generation module 220 will be described later in further detail with reference to FIGS. 6A and 6B.

The row decoder 250 is provided with a row address XA by the pre-decoder 120, and chooses a nonvolatile memory cell MC column, on which a write/read operation is to be performed, based on the row address XA. For example, the row decoder 124 provides a plurality of row selection signals X0 through Xm to the row selection circuit 60, and enables a row selection transistor in the row selection circuit 60. The level of a row bias VPP_X, which is applied to the row decoder 250 during a write or read operation, may be higher than the level of a power supply voltage VCC.

The address buffer 110 is provided with an external address EADDR, buffers the external address EADDR, and provides a read address RADDR to perform a read operation or a write address WADDR to perform a write operation to the pre-decoder 120.

The write circuit 320 is coupled to the bit lines BL0 through BLn, and writes data in the memory cell array 10. The write circuit 320 includes a data input buffer 325 and a write driver 323. The data input buffer 325 is provided with external data, buffers the external data, and provides write data WDATA to the write driver 323. The write driver 323 is provided with the write data WDATA and writes data to a number of nonvolatile memory cells MC chosen from the memory cell array 10.

The read circuit 310 is coupled to the bit lines BL0 through BLn, and reads data from the memory cell array 10. The read circuit 310 includes a sense amplifier 313 and a data output buffer 315. The sense amplifier 313 reads read data RDATA from a number of nonvolatile memory cells MC chosen from the memory cell array 10. The data output buffer 315 outputs the read data RDATA.

The operation of the nonvolatile memory device shown in FIG. 1 will hereinafter be described in further detail with reference to FIGS. 3 through 5.

Figure 3:
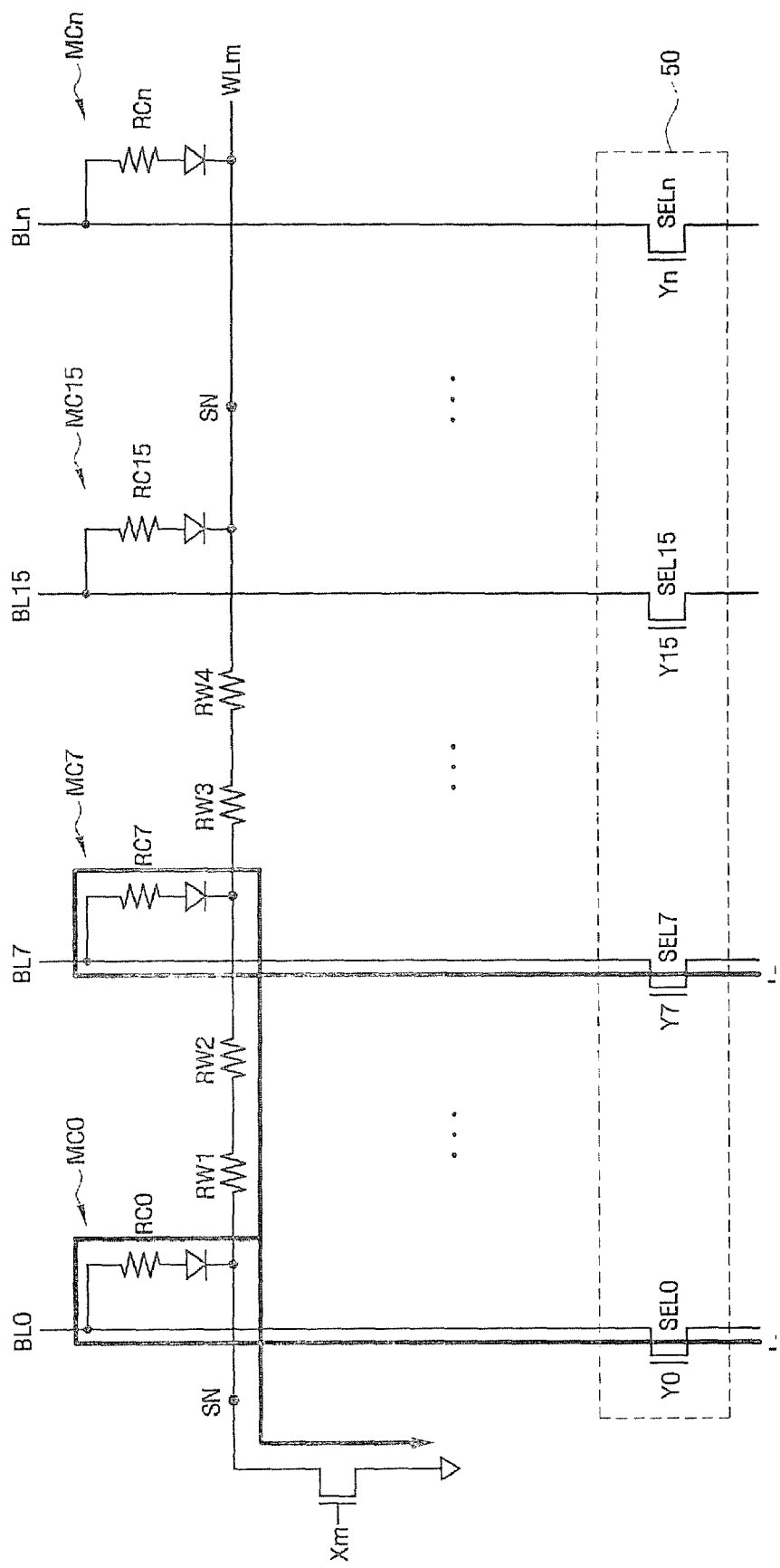
FIG. 3 is a circuit diagram illustrating selection of a bit line by a column selection circuit shown in FIG. 1.

FIG. 3 is a circuit diagram illustrating selection of a bit line by the column selection circuit 50. In FIG. 3, only one word line, i.e., the word line WLm, is illustrated by way of example. Parasitic resistances of word line WLm are illustrated along word line WLm, and a plurality of variable resistive elements RC0 to RCN are illustrated as resistors. Referring to FIG. 3, a total of sixteen bit lines may be arranged between a pair of adjacent strapping nodes SN of word line WLm. However, a number of bit lines arranged between the pair of adjacent strapping nodes SN is not restricted to that set forth herein. FIG. 4 is a perspective view of a nonvolatile memory device with word lines that include strapping lines. For convenience, the nonvolatile memory device is illustrated in FIG. 4 without an interlayer dielectric layer and without an inter-metal dielectric layer. FIG. 5 is a graph illustrating variation of a current that flows in each nonvolatile memory cell according to a column selection signal applied to each of the column selection switches SEL0 through SELn shown in FIG. 3.

Referring to FIG. 3, during a write operation, one of the column selection switches SEL0 through SELn is enabled in response to the column selection signals Y0 through Yn provided by the column decoder 210. As a result, one of a plurality of nonvolatile memory cells MC0 through MCn, for example, the nonvolatile memory cell MC0, is chosen, and a write current (e.g., a set pulse or a reset pulse) is applied to the nonvolatile memory cell MC0.

During the write operation, a write current $I_O$ provided by the write driver 323 of the write circuit 320 flows through a column selection transistor (e.g., the column selection switch SEL0) in the column selection circuit 50, a bit line (e.g., the bit line BL0) chosen from the bit lines BL0 through BLm, a nonvolatile memory cell (e.g., the nonvolatile memory cell MC0) corresponding to the chosen bit line, the word line WLm, and a row selection transistor in the row selection circuit 60.

However, even if a uniform voltage is provided by the write circuit 320 to each of the bit lines BL0 through BLn, different resistance levels may be stored in the nonvolatile memory cells MC0 through MCn because of the positions of the nonvolatile memory cells MC0 through MCn, and more particularly, because of the positions of the bit lines BL0 through BLn. More specifically, resistance levels between a ground and the nonvolatile memory cells MC0 through MCn may differ from one another because the distances between the ground and the bit lines BL0 through BLn differ from one another resulting in different parasitic resistances.

Figure 4:
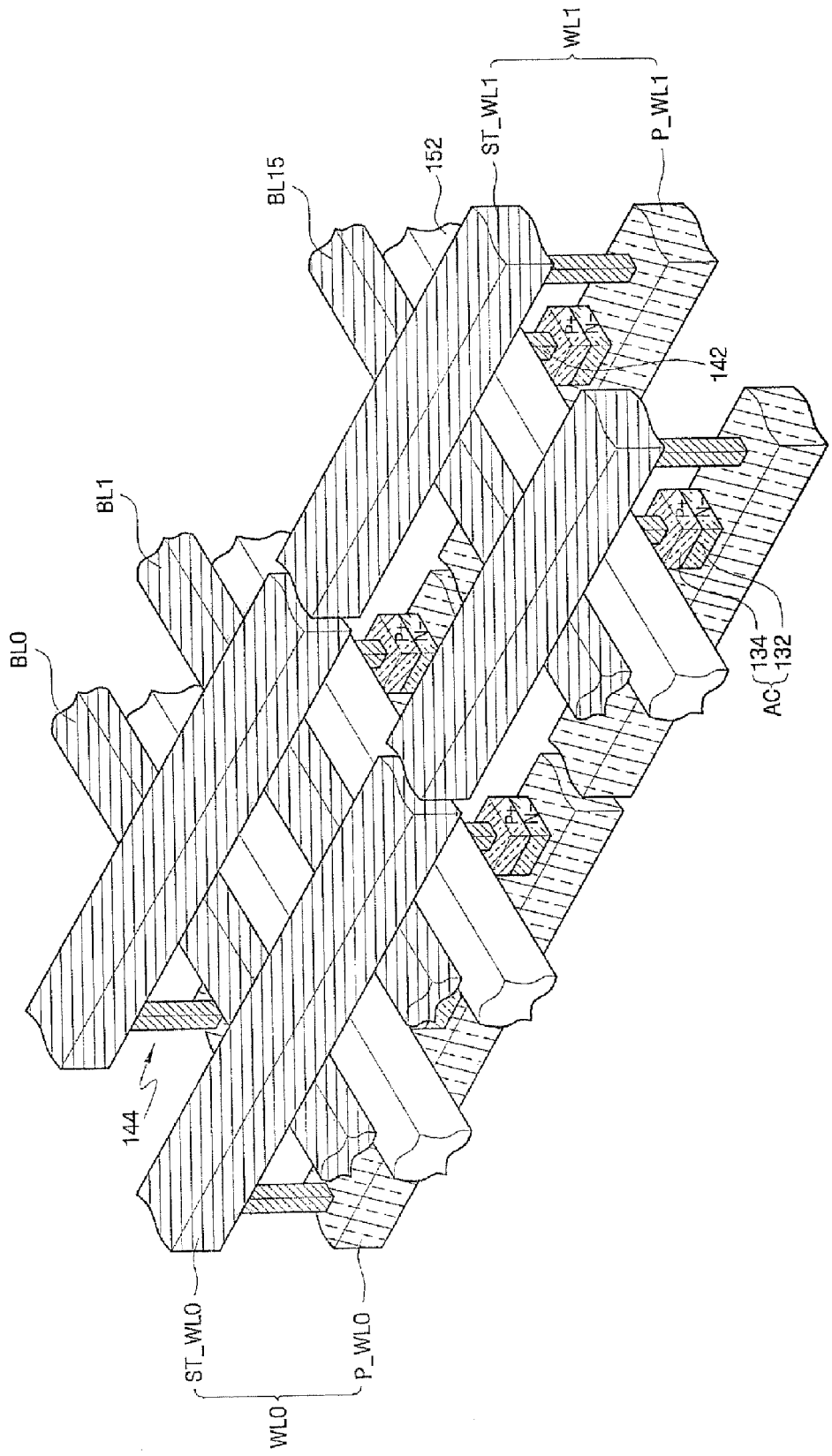
FIG. 4 is a perspective view of a nonvolatile memory device whose word lines include strapping lines.

If the word line WL0 includes a first word line and a second word line (i.e., a strapping line) having a lower resistance than the first word line, as illustrated in FIG. 4, resistance levels between the ground and the nonvolatile memory cells MC0 through MCn may be determined by the distances between a strapping node SN and the bit lines BL0 through BLn.

More specifically, referring to FIG. 4, the nonvolatile memory device may include a plurality of first word lines P_WL0 and P_WL1, a plurality of first semiconductor patterns 132 disposed on each of the first word lines P_WL0 and P_WL1, a plurality of second semiconductor patterns 134 disposed on the respective first semiconductor patterns 132, a plurality of variable resistive patterns 152 disposed above the second semiconductor patterns 134, a plurality of bit lines BL0 through BL15 disposed above the variable resistive patterns 152, and a plurality of second word lines ST_WL0 and ST_WL1 disposed above the bit lines BL0 through BL15. The first word line P_WL0 and the second word line ST_WL0 may form the word line WL0 shown in FIG. 3, and the first word line P_WL1 and the second word line ST_WL1 may form the word line WL1 shown in FIG. 3.

The first word lines P_WL0 and P_WL1 may be formed of a conductive material such as polysilicon or a metal and may extend in a first direction. For example, a conductivity type of the first word lines P_WL0 and P_WL1 may be N+ type. More specifically, the first word lines P_WL0 and P_WL1 may be N+ type epitaxial layers. If the semiconductor substrate of the nonvolatile memory device is a monocrystalline semiconductor substrate, the first word lines P_WL0 and P_WL1 may be monocrystalline. Stated in other words, the first word lines may be provided as doped regions of a monocrystalline semiconductor substrate.

The first semiconductor patterns 132, which are formed on each of the first word lines P_WL0 and P_WL1, may be of an N− type. The second semiconductor patterns 134, which are formed on the respective first semiconductor patterns 132, may be of a P+ type. More specifically, the first semiconductor patterns 132 and the second semiconductor patterns 134 may be aligned with the first direction, i.e., the direction in which the word lines WL0 and WL1 extend, and may form the access elements AC of nonvolatile memory cells MC, i.e., cell diodes.

The variable resistive patterns 152 may be formed above the first semiconductor patterns 132 and the second semiconductor patterns 134, and may be connected to the first semiconductor patterns 132 and the second semiconductor patterns 134 through a plurality of lower electrode contacts 142. The variable resistive patterns 152 may be formed of a phase-change material. The variable resistive patterns 152 are illustrated in FIG. 4 as being formed as lines so as to correspond to a plurality of PRAM cells, but the present invention is not so restricted. That is, the variable resistive patterns 152 may be formed as dots (or discrete patterns of the phase change material) respectively corresponding to variable resistive cells.

The bit lines BL0 through BL15 are disposed above the variable resistive patterns 152, and extend in parallel with the variable resistive patterns 152, and intersect the word lines WL0 and WL1. The bit lines BL0 through BL15 may be connected to the variable resistive patterns 152 through a plurality of bit line contact plugs (not shown), and may be formed of a metal such as aluminum (Al) or tungsten (W).

The second word lines ST_WL0 and ST_WL1 are disposed above the bit lines BL0 through BL15, extend in parallel with the first word lines P_WL0 and P_WL1, and are connected to the first word lines P_WL0 and P_WL1 through a plurality of strapping line contact plugs 144. The nodes at which the first word lines P_WL0 and P_WL1 are connected to the second word lines ST_WL0 and ST_WL1 through the strapping line contact plugs 144 may be the strapping nodes SN shown in FIG. 3.

The second word lines ST_WL0 and ST_WL1 are strapping lines, and may be formed of a metal having a lower resistance than that of the first word lines P_WL0 and P_WL1. For example, the second word lines ST_WL0 and ST_WL1 may be formed of a metal such as aluminum or tungsten. The second word lines ST_WL0 and ST_WL1 may be connected to the variable resistive patterns 152 through the first word lines P_WL0 and P_WL1. The second word lines ST_WL0 and ST_WL1 are illustrated in FIG. 4 as being disposed above the bit lines BL0 through BL15, but embodiments of the present invention are not so restricted. For example, the second word lines ST_WL0 and ST_WL1 may be interposed between the first word lines P_WL0 and P_WL1 and the bit lines BL0 through BL15.

Referring to FIG. 3, when the word line WLm includes the first (or primary) word line P_WLm and the second (or strapping) word line ST_WLm, which is a strapping line, resistance levels between the ground and the nonvolatile memory cells MC0 through MCn may differ from one another. That is, once one of the bit lines BL0 through BLn is chosen according to the column address YA, the resistance between the ground and whichever of the nonvolatile memory cells MC0 through MCn corresponds to the chosen bit line may be determined by the distance, in the first direction, between a strapping node SN and the chosen bit line. For example, the resistance between the ground and a nonvolatile memory cell (e.g., the nonvolatile memory cell MC7) coupled to a bit line (e.g., BL7) relatively distant from a strapping node SN may be higher than the resistance between the ground and a nonvolatile memory cell (e.g., the nonvolatile memory cell MC0 or MC15) coupled to a bit line (e.g., the bit line BL0 or BL15) relatively near a strapping node SN by $R_{W0}+R_{W1}+R_{W2}$. Referring to FIG. 3, reference characters $R_{W1}$ through $R_{W4}$ indicate various parasitic resistance levels that the first word line P_WL1 of the word line WLm may selectively have according to distances from a strapping node SN, and RC0 through RCn indicate resistance levels of the variable resistive elements RC of the nonvolatile memory cells MC0 through MCn.

Therefore, even if the write driver 323 applies a plurality of signals having the same level to the bit lines BL0 through BLn to store the same resistance level in the nonvolatile memory cells MC0 through MCn, different currents may be applied to the nonvolatile memory cells MC0 through MCn. As a result, different resistance levels may be stored in the nonvolatile memory cells MC0 through MCn during a write operation. In addition, if sensing margins decrease due to a wide range of resistance levels stored in the nonvolatile memory cells MC0 through MCn, errors may occur during a read operation.

Figure 5:
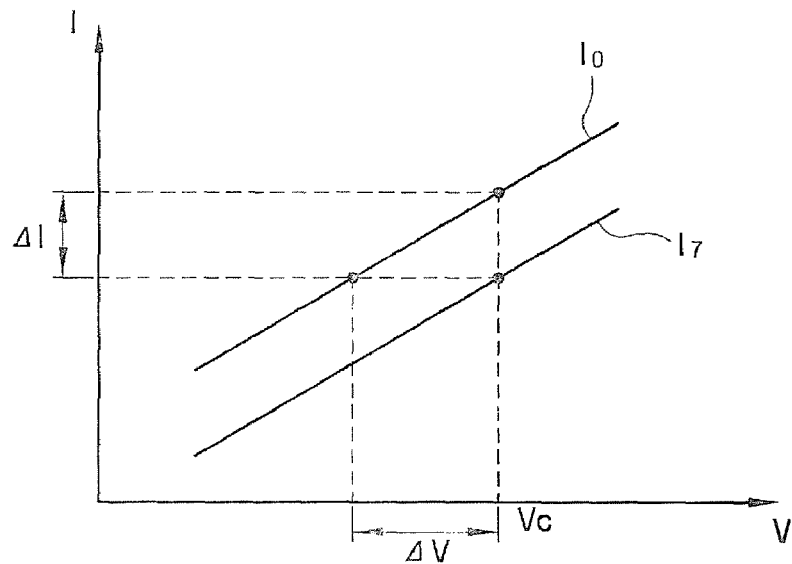
FIG. 5 is a graph of various currents that can flow in a nonvolatile memory cell according to a level of a column selection signal applied to each column selection switch shown in FIG. 3.

Referring to FIG. 5, even if the column selection signals Y0 through Yn having the same level, for example, a voltage $V_C$, are applied to the column selection switches SEL0 through SELn, different write currents may be applied to the nonvolatile memory cells MC0 through MCn according to the column address YA. More specifically, a write current $I_0$ applied to a nonvolatile memory cell (e.g., the nonvolatile memory cell MC0) coupled to a bit line (e.g., the bit line BL0) relatively near a strapping node SN may be an amount ΔI higher than a write current $I_7$ applied to a nonvolatile memory cell (e.g., the nonvolatile memory cell MC7) coupled to a bit line (e.g., the bit line BL7) relatively distant from a strapping node SN. That is, even though the write driver 323 applies signals having the same voltage level to the bit lines BL0 through BLn, a higher resistance level may be written to a nonvolatile memory cell (e.g., the nonvolatile memory cell MC0) coupled to a bit line (e.g., the bit line BL0) relatively near a strapping node SN than to a nonvolatile memory cell (e.g., the nonvolatile memory cell MC7) coupled to a bit line (e.g., the bit line BL7). As a result, different resistance levels may be stored in the nonvolatile memory cells MC0 through MCn.

The column selection signals Y0 through Yn applied to the column selection switches SEL0 through SELn may not necessarily have the same turn-on signal (e.g., voltage) level. More specifically, at least two of the column selection signals Y0 through Yn may be provided with different turn-on signal (e.g., voltage) levels. Therefore, it may be possible to more stably perform a write operation regardless of the column address YA.

The turn-on levels of the column selection signals Y0 through Yn may be determined by the distance between a strapping node SN on each of the word lines WL0 through WLm and whichever of the bit lines BL0 through BLn is chosen according to the column address YA. For example, the turn-on level of the column selection signal Y7 used to choose the bit line BL7, which is relatively distant from a strapping node SN on the word line WLm, may be an amount ΔV higher than the turn-on level of the column selection signal Y0 used to choose the bit line BL0, which is relatively near a strapping node SN on the word line WLm.

Accordingly, even if the resistance on each of the word lines WL0 through WLm varies, from the viewpoint of the nonvolatile memory cells MC0 through MCn, according to the column address YA, such variations in the resistance on each of the word lines WL0 through WLm may be compensated for by adjusting the turn-on signal (e.g., voltage) levels of the local column selection signals LY0 through LY3. That is, if signals having the same turn-on level are applied to the bit lines BL0 through BLn by the write driver 323, the nonvolatile memory cells MC0 through MCn may be provided with the same current. Therefore, it is possible to more stably perform a write operation regardless of the column address YA.

Operations of the nonvolatile memory device shown in FIG. 1 have been described for a write operation where a write current is provided to the nonvolatile memory cells MC0 through MCn using write circuit 320. Embodiments of the present invention, however, are not restricted to write operations. During a read operation, a read current (which is similar to a write current) flows to a ground through a column selection transistor in the column selection circuit 50, a bit line (e.g., the bit line BL0) chosen from the bit lines BL0 through BLm, a nonvolatile memory cell (e.g., the nonvolatile memory cell MC0) corresponding to the chosen bit line, the word line WLm, and a row selection transistor in the row selection circuit 60.

Therefore, even if the resistance on each of the word lines WL0 through WLm varies, from the perspective of nonvolatile memory cells MC0 through MCn, according to the column address YA, such variations in the resistance on each of the word lines WL0 through WLm may be compensated for by adjusting turn-on levels of the local column selection signals LY0 through LY3. If signals having the same level (e.g., voltage) are applied to the bit lines BL0 through BLn by the write driver 323, the nonvolatile memory cells MC0 through MCn may be provided with a same current. Therefore, it may be possible to more stably perform read operations regardless of the column address YA.

Figure 6A:
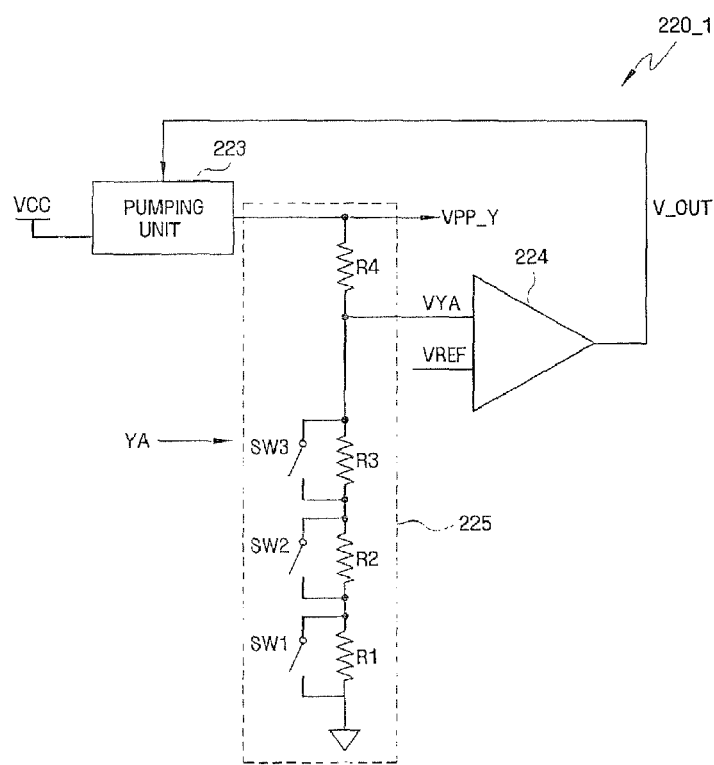
FIGS. 6A and 6B are block diagrams of embodiments of a column bias generation module shown in FIG. 1.
Figure 6B:
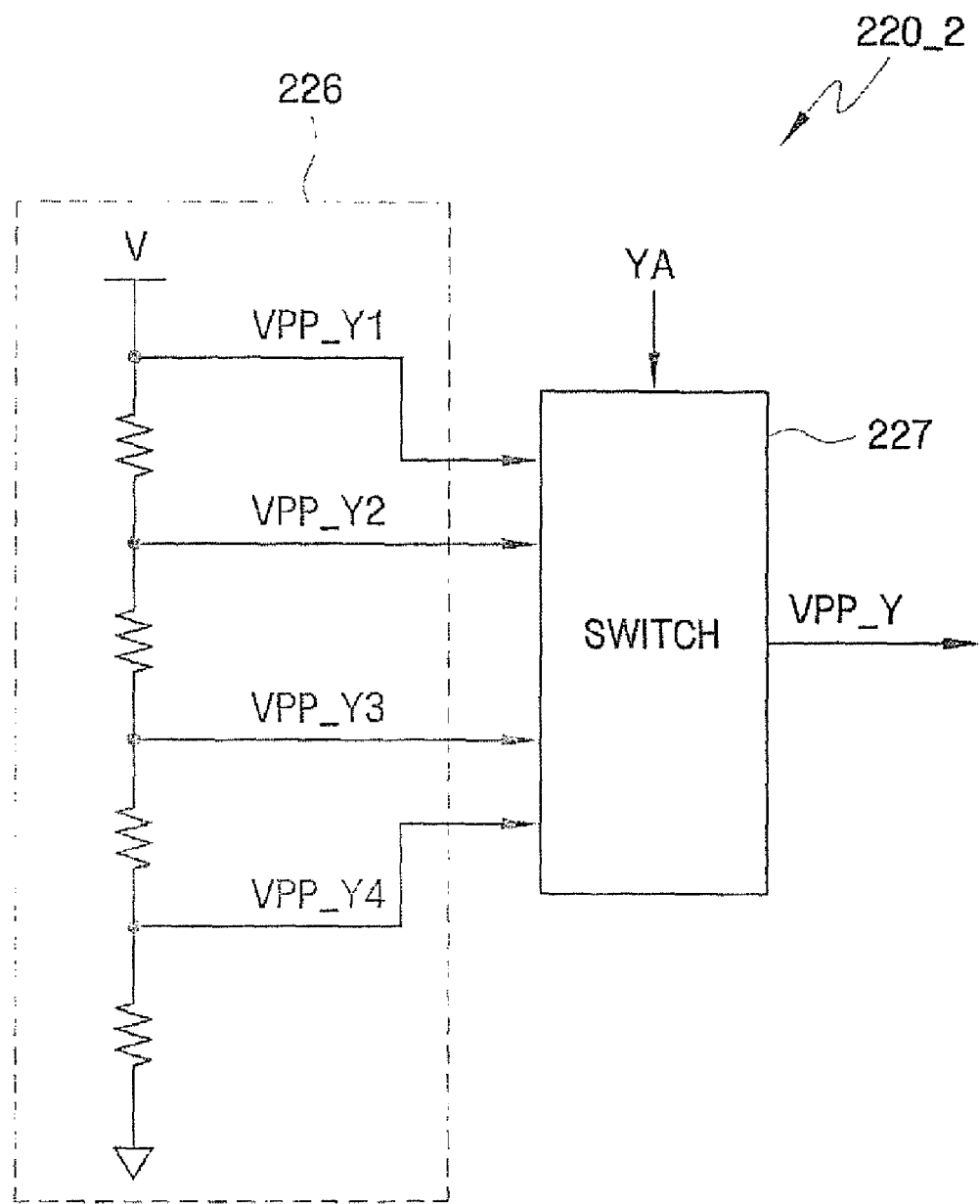

FIGS. 6A and 6B illustrate circuit diagrams of examples of embodiments of the column bias generation module 220 shown in FIG. 1.

Referring to FIG. 6A, a column bias generation module 220_1 provides a column bias VPP_Y signal (e.g., voltage) level having more than one level using column address YA. The column bias generation module 220_1 includes comparison unit 224 and pumping unit 223.

The comparison unit 224 compares a signal (e.g., voltage) level of a first node VYA (determined by column address YA) and a signal (e.g., voltage) level of a second node VREF to which a reference bias is applied, and provides pumping unit 223 with a voltage V_OUT as the result of the comparison. For example, if the level of first node VYA is lower than the level of second node VREF (i.e., the level of the reference bias) the comparison unit 224 may output a voltage V_OUT having a relatively high level to the pumping unit 223. On the other hand, if the level of first node VYA is higher than the level of second node VREF (i.e., the level of the reference bias) the comparison unit 224 may output a voltage V_OUT having a relatively low level to the pumping unit 223.

The first node VYA of the comparison unit 224 is coupled to a level determining circuit 225, and the output level of the level determining circuit 225 is determined by the column address YA. Referring to FIG. 6A, the level determining circuit 225 may include a plurality of resistors R1 through R4 connected in series, and a plurality of switches SW1 through SW3, which are turned on or off according to the column address YA to provide a plurality of bypass paths bypassing resistors R1 through R4. Therefore, even if a relatively uniform voltage is provided by the pumping unit 223 at first node VYA, the uniform voltage may be divided differently according to the column address, and thus, a level of the column bias VPP_Y may vary.

For example, the number of switches that are turned on in the level determining circuit 225 when a column address YA used to choose a bit line (e.g., the bit line BL0) near a strapping node SN on each of the word lines WL0 through WLm is received may be less than the number of switches that are turned on in the level determining circuit 225 when a column address YA used to choose a bit line (e.g., the bit line BL7) relatively distant from a strapping node SN on each of the word lines WL0 through WLm is received. Therefore, given that a relatively uniform voltage is provided by the pumping unit 223, fewer bypass paths may be generated when a column address YA used to choose a bit line relatively near a strapping node SN on each of the word lines WL0 through WLm is received than when a column address YA used to choose a bit line relatively distant from a strapping node SN on each of the word lines WL0 through WLm is received, and thus, a level of the first node VYA may be higher when a column address YA used to choose a bit line relatively near a strapping node SN on each of the word lines WL0 through WLm is received than when a column address YA used to choose a bit line relatively distant from a strapping node SN on each of the word lines WL0 through WLm is received.

The pumping unit 223 boosts the power supply voltage VCC and thus provides the column bias VPP_Y. The level of the column bias VPP_Y may be determined according to the voltage V_OUT provided by the comparison unit 224. For example, if the level of the first node VYA is lower than the level of the second node VREF, the pumping unit 223 may boost the power supply voltage VCC until the level of the first node VYA is raised to the level of the second node VREF.

Accordingly, the pumping unit 223 may provide a higher column bias VPP_Y when a column address YA used to choose a bit line (e.g., the bit line BL7) relatively distant from a strapping node SN on each of the word lines WL0 through WLm is received than when a column address YA used to choose a bit line (e.g., the bit line BL0) relatively near a strapping node SN on each of the word lines WL0 through WLm is received.

Referring to FIG. 6B, a column bias generation module 220_2 provides a column bias having more than one level in response to the column address YA. The column bias generation module 220_2 includes a driving bias generation unit 226 and a switch unit 227.

The driving bias generation unit 226 is provided with a reference voltage V and generates a plurality of driving biases VPP_Y1 through VPP_Y4 having different levels based on the voltage V. The voltage V may be a boosted voltage higher than the power supply voltage VCC.

The driving bias generation unit 226 may include a plurality of resistors connected in series and may thus generate the driving biases VPP_Y1 through VPP_Y4 using voltage division.

The switch unit 227 may choose one of the driving biases VPP_Y 1 through VPP_Y4 according to the column address YA and may provide the chosen driving bias to the column decoder 210. For example, if a column address YA used to choose a bit line (e.g., the bit line BL0) near a strapping node SN on each of the word lines WL0 through WLm is received, the switch unit 227 may provide the driving bias VPP_Y4 having the first level as the column bias VPP_Y. On the other hand, if a column address YA used to choose a bit line (e.g., the bit line BL7) relatively distant from a strapping node SN on each of the word lines WL0 through WLm is received, the switch unit 227 may provide the driving bias VPP_Y1 having the second level, which is higher than the first level, as the column bias VPP_Y.

Figure 7:
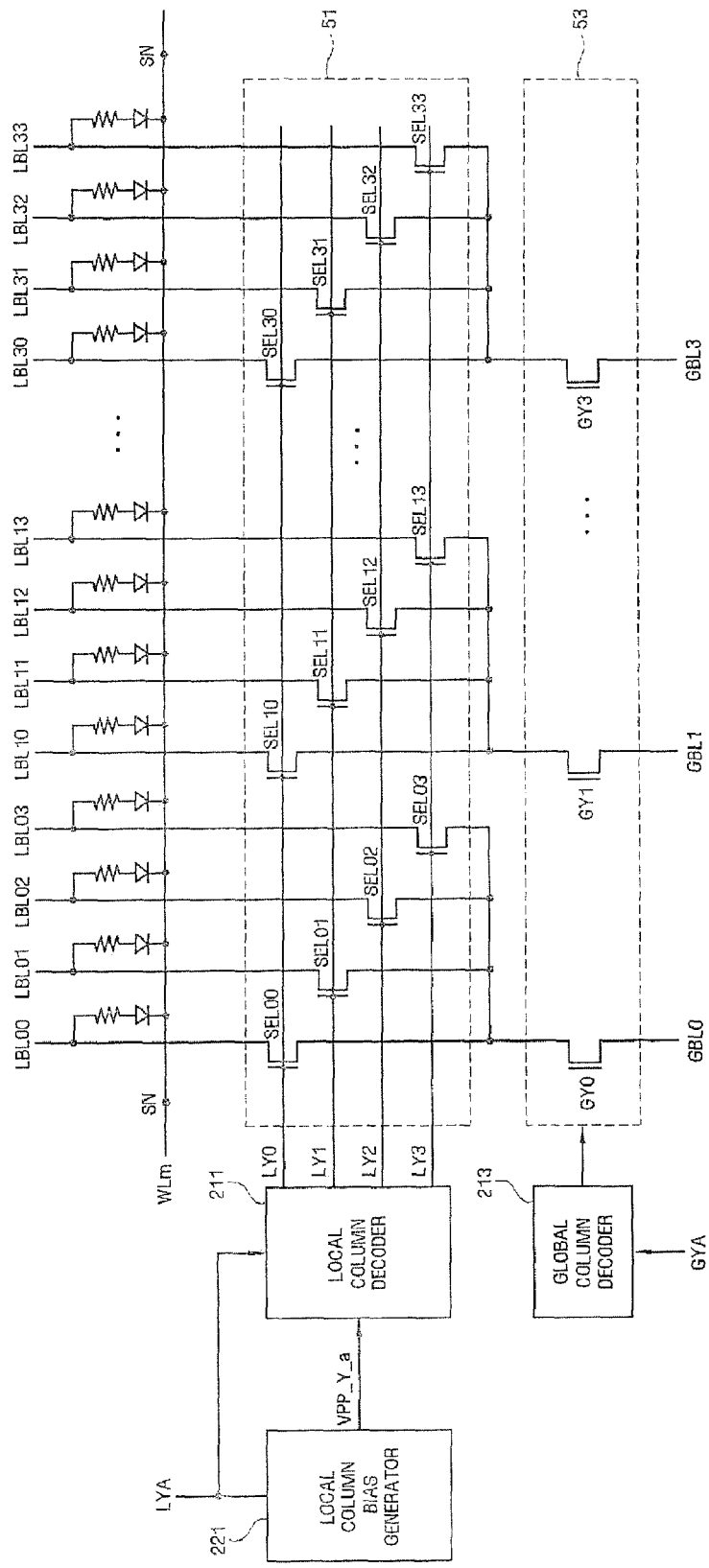
FIG. 7 is a circuit diagram of a nonvolatile memory device according to other embodiments of the present invention.

FIG. 7 illustrates a circuit diagram of a nonvolatile memory device according to other embodiments of the present invention. Referring to FIG. 7, a total of sixteen local bit lines may be arranged between a pair of adjacent strapping nodes SN, but other embodiments of the present invention are not so restricted. In addition, referring to FIG. 7, four local bit lines may be coupled to each global bit line, but other embodiments of the present invention are not so restricted.

Referring to FIG. 7, the nonvolatile memory device may include a plurality of global bit lines GBL0 through GBL3 and a plurality of local bit lines LBL00 through LBL33 and may thus realize a hierarchical bit line architecture. Stated in other words, the local bit lines LBL00 through LBL33 may be selectively coupled to respective global bit lines GBL0 through GBL3 through a local column selection circuit 51. The local bit lines LBL00 through LBL33 may be respectively coupled to a plurality of columns of a matrix of nonvolatile memory cells MC. In this case, a pre-decoder (not shown) may provide a column address YA including a local column address LYA and a global column address GYA.

More particularly, the nonvolatile memory device may include a local column selection circuit 51, a local column decoder 211, a local column bias generation module 221, a global column selection circuit 53 and a global column decoder 213.

The local column selection circuit 51 may include a plurality of local column selection switches SEL00 through SEL33. The local column selection switches SEL00 through SEL33 are respectively coupled to the local bit lines LBL00 through LBL33. Each of the local column selection switches SEL00 through SEL33 chooses at least one of the local bit lines LBL00 through LBL33 in response to a plurality of local column selection signals LY0 through LY3. The column selection signals LY0 through LY3 may not necessarily be provided at a small signal (e.g., voltage) level. More particularly, at least two of the column selection signals LY0 through LY3 may be provided at different levels. As described above, the levels of the local column selection signals LY0 through LY3 may be determined according to a distance between a strapping node SN on each of a plurality of word lines WL0 through WLm and whichever of the local bit lines LBL00 through LBL33 is chosen according to the local column address LYA.

For example, the signal (e.g., voltage) level of a local column selection signal (e.g., the local column selection signal LY3) applied to a local column selection switch (e.g., the local column selection switch SEL03) coupled to a local bit line (e.g., the local bit line LBL03) relatively distant from a strapping node SN may be higher than the signal (e.g., voltage) level of a local column selection signal (e.g., the local column selection signal LY0) applied to a local column selection switch (e.g., the local column selection switch SEL00) coupled to a local bit line (e.g., the local bit line LBL00) relatively near a strapping node SN.

Alternatively, the local column switches SEL00 through SEL33 may be classified into three local column switch groups according to which of the global bit lines GBL0 through GBL3 is connected thereto, and the level of local bit line selection signals LY0 through LY3 applied to one local column switch group may differ from the level of local bit line selection signals LY0 through LY3 applied to another local column switch group. That is, local column selection signals LY0 through LY3 having the same level may be applied to a number of local column switches classified into the same local column switch group. For example, the level of local column selection signals LY0 through LY3 applied to a number of local column selection switches (e.g., the local column selection switches SEL10 through SEL13) coupled to a global bit line (e.g., the global bit line GBL2) relatively distant from a strapping node SN may be higher than the level of local column selection signals LY0 through LY3 applied to a number of local column selection switches (e.g., the local column selection switches SEL00 through SEL03 or SEL30 through SEL33) coupled to a global bit line (e.g., the global bit line GBL0 or GBL3) relatively near a strapping node SN.

Accordingly, even if the resistance of each of the word lines WL0 through WLm varies, from the perspective of nonvolatile memory cells, according to the local column address LYA, such variations in the resistance of each of the word lines WL0 through WLm may be compensated for by adjusting the levels of the local column selection signals LY0 through LY3. Therefore, it may be possible to more stably perform a write operation or a read operation regardless of the local column address LYA. Stated in other words, differences in wordline resistances experienced by different memory cells may be compensated for by providing different turn-on resistances at different column selection transistors using different turn-on signal (e.g., voltage) levels for different column selection signals.

The local column decoder 211 may be provided with a local column bias VPP_Y_a by the local column bias generation module 221, and may be provided with the local address LYA by the pre-decoder. Then, the local column decoder 211 provides the local column selection signals LY0 through LY3 to the local column decoder 211. The local column selection signals LY0 through LY3 may have at least two different turn-on signal (e.g., voltage) levels, and the turn-on signal (e.g., voltage) levels of the local column selection signals LY0 through LY3 may be determined by the local column address LYA.

The local column bias generation module 221 may provide the local column bias VPP_Y_a having at least two different turn-on levels to the local column decoder 211 in response to the local column address LYA provided by the pre-decoder.

The global column selection circuit 53 selectively couples the global bit lines GBL0 through GBL3 to a read circuit (not shown) and/or a write circuit (not shown) in response to a plurality of global column selection signals GY0 through GY3. The turn-on global column selection signals GY0 through GY3, unlike the turn-on local column selection signals LY0 through LY3, may be provided at the same level.

Figure 8:
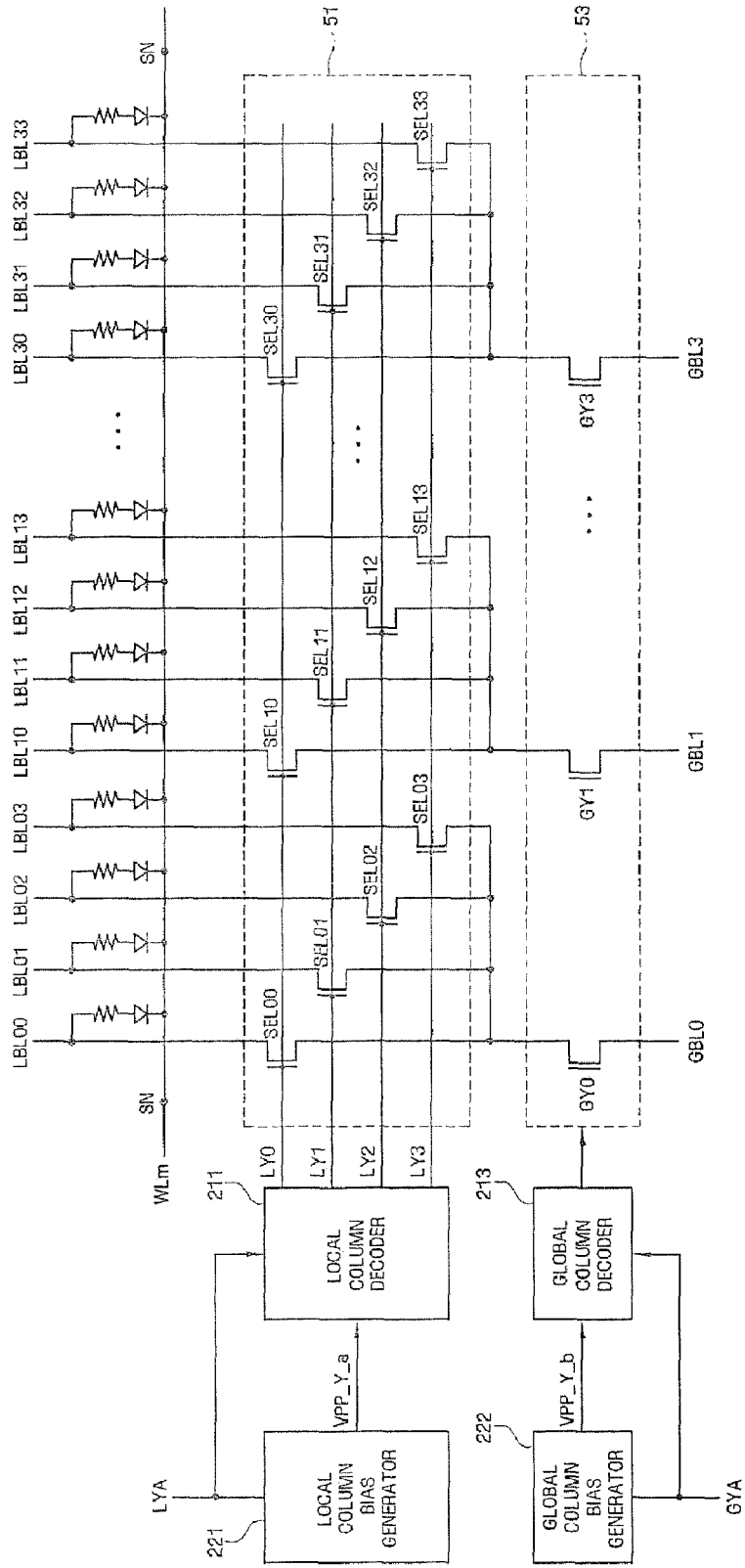
FIG. 8 is a circuit diagram of a nonvolatile memory device according to still other embodiments of the present invention.

FIG. 8 illustrates a circuit diagram of a nonvolatile memory device according to other embodiments of the present invention. In embodiments of FIG. 8, unlike in embodiments of FIG. 7, a plurality of global column selection signals GY0 through GY3 may not necessarily have a same turn-on signal (e.g., voltage) level, but at least two of the global column selection signals GY0 through GY3 have different turn-on signal (e.g., voltage) levels. Referring to FIG. 8, the nonvolatile memory device may include a global column bias generation module 222 providing a global column bias VPP_Y_b having at least two different turn-on levels according to a global column address.

More specifically, a local column decoder 211 may provide a plurality of local column selection signals LY0 through LY3 to a local column selection circuit 51 so that one of a plurality of local bit lines LBL00~LBL33 can be chosen. The local column selection signals LY0 through LY4 may have at least two different turn-on levels, and the turn-on levels of the local column selection signals LY0 through LY4 may be determined by a local column address LYA.

A global column decoder 213 may provide the global column selection signals GY0 through GY3 to a global column selection circuit 53 so that one of a plurality of global bit lines GBL0 through GBL3 can be chosen. The global column selection signals GY0 through GY3 may have at least two different turn-on levels, and the levels of the global column selection signals GY0 through GY3 may be determined by a global column address GYA.

Accordingly, it may be possible to more effectively compensate for variations in the resistance on each of a plurality of word lines WL0 through WLm by adjusting not only the turn-on levels of the local column selection signals LY0 through LY3 but also the turn-on levels of the global column selection signals GY0 through GY3. Therefore, it may be possible to more stably perform write and/or read operations.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A nonvolatile memory device comprising:
   a memory cell array comprising a plurality of nonvolatile memory cells arranged in an array of rows and columns;
   a plurality of bit lines wherein each of the plurality of bit lines is coupled to nonvolatile memory cells in a respective one of the columns of the array;
   a plurality of column selection switches wherein each of the plurality of column selection switches is coupled to a respective one of the bit lines; and
   a column decoder coupled to the plurality of column selection switches wherein the column decoder is configured to select a first one of the bit lines using a first column selection signal having a first signal level applied to a first one of the column selection switches and to select a second one of the bit lines using a second column selection signal having a second signal level applied to a second one of the column selection switches wherein the second signal level is different than the first signal level.

2. The nonvolatile memory device according to claim 1 wherein the column selection switches include first and second groups of column selection switches wherein the column decoder is configured to select bit lines coupled to column selection switches of the first group using first column selection signals having the first signal level and to select bit lines coupled to column selection switches of the second group using second column selection signals having the second signal level.

3. The nonvolatile memory device according to claim 1 further comprising:
   a plurality of word lines wherein each of the plurality of word lines is coupled to nonvolatile memory cells in a respective one of the rows of the array, wherein each word line includes a primary word line having a first resistance and a strapping word line having a second resistance less than the first resistance, wherein the primary and strapping word lines are electrically coupled through at least one strapping node, and wherein the first bit line is relatively near the at least one strapping node and the second bit line is relatively distant from the at least one strapping node, and wherein the second signal level is greater than the first signal level.

4. The nonvolatile memory device according to claim 1 further comprising:
   a column bias generator coupled to the column decoder, wherein the column bias generator is configured to generate first and second column bias signals having the first and second signal levels and wherein the column decoder is configured to provide the first and second column bias signals from the column bias generator as the first and second column selection signals.

5. The nonvolatile memory device according to claim 4, wherein the column bias generator includes a driving bias generator that simultaneously generates first and second driving biases respectively having the first and second signal levels and a switch configured to select the first driving bias as the first column bias signal responsive to a first column address and to select the second driving bias as the second column bias signal responsive to a second column address different than the first column address.

6. The nonvolatile memory device according to claim 4 wherein the column bias generator includes a comparison unit configured to compare a signal level of a first node with a first reference signal, a pumping unit configured to generate one of the first and the second column bias signals at an output node responsive to an output of the comparison unit, wherein a signal level of the first node is determined by using column address.

7. The nonvolatile memory device according to claim 6 further comprising:
   a resistive coupling between the first node and the output node, and a variable resistive coupling between the first node and a second node, wherein the variable resistive coupling provides a first resistance responsive to a first column address and a second resistance different than the first resistance responsive to a second column address.

8. A nonvolatile memory device comprising:
   a memory cell array comprising a plurality of nonvolatile memory cells arranged in an array of rows and columns;
   a plurality of word lines wherein each of the plurality of word lines is coupled to nonvolatile memory cells in a respective one of the rows of the array;
   a plurality of bit lines wherein each of the plurality of bit lines is coupled to nonvolatile memory cells in a respective one of the columns of the array;
   a column selection circuit including a plurality of column selection switches wherein each of the plurality of column selection switches is coupled to a respective one of the bit lines; and
   a column decoder applying a column selection signal to the column selection circuit wherein a signal level of the column selection signal is determined by using column address.

9. The nonvolatile memory device according to claim 8 wherein the column decoder is configured to apply a first column selection signal having a first signal level to a first one of the column selection switches in response to a first column address and to apply a second column selection signal having a second signal level to a second one of the column selection switches in response to a second column address, wherein the first column address identifies a first one of the bit lines coupled to the first selection switch, wherein the second column address identifies a second one of the bit lines coupled to the second selection switch, and wherein the first and second signal levels are different.

10. The nonvolatile memory device according to claim 9 wherein each of the plurality of word lines includes a primary word line having a first resistance and a strapping word line having a second resistance less than the first resistance, and wherein the primary and strapping word lines are electrically coupled through at least one strapping node.

11. The nonvolatile memory device according to claim 10 wherein the first bit line is relatively near the at least one strapping node and the second bit line is relatively distant from the at least one strapping node, and wherein the second signal level is greater than the first signal level.

12. The nonvolatile memory device according to claim 10 wherein the primary word line comprises polysilicon.

13. The nonvolatile memory device according to claim 10 wherein the primary word line comprises n-type silicon and the strapping word line comprises metal.

14. The nonvolatile memory device according to claim 9 further comprising:
a column bias generator coupled to the column decoder, wherein the column bias generator is configured to generate first and second column bias signals having the first and second signal levels and wherein the column decoder is configured to provide the first and second column bias signals from the column bias generator as the first and second column selection signals.

15. The nonvolatile memory device according to claim 14 wherein the column bias generator includes a driving bias generator that simultaneously generates first and second driving biases respectively having the first and second signal levels and a switch configured to select the first driving bias as the first column selection signal responsive to the first column address and to select the second driving bias as the second column selection signal responsive to the second column address.

16. The nonvolatile memory device according to claim 14 wherein the column bias generator includes a comparison unit configured to compare a signal level of a first node with a first reference signal, a pumping unit configured to generate one of the first and the second column bias signals at an output node responsive to an output of the comparison unit, wherein a signal level of the first node is determined by using column address.

17. The nonvolatile memory device according to claim 16 further comprising:
a resistive coupling between the first node and the output node, and a variable resistive coupling between the first node and a second node, wherein the variable resistive coupling provides a first resistance responsive to the first column address and a second resistance different than the first resistance responsive to the second column address.

18. The nonvolatile memory device according to claim 9 wherein the plurality of bit lines includes a plurality of groups of local bit lines and a plurality of global bit lines wherein each of the global bit lines is associated with a respective one of the groups of local bit lines, wherein each of the local bit lines is coupled to nonvolatile memory cells of a respective column of the array, and wherein each of the global bit lines is selectively coupled with one of the local bit lines of the respective group.

19. The nonvolatile memory device according to claim 18 wherein
the column selection switches of the column selection circuit include a plurality of local selection switches respectively coupled to the local bit lines, and
the column decoder is configured to apply the first column selection signal having the first signal level to a first one of the local selection switches in response to the first column address and to apply the second column selection signal having the second signal level to a second one of the local selection switches in response to the second column address, wherein the first column address identifies a first one of the local bit lines coupled to the first local selection switch, wherein the second column address identifies a second one of the local bit lines coupled to the second local selection switch, wherein the first and second signal levels are different.

20. The nonvolatile memory device according to claim 8 wherein each of the nonvolatile memory cells comprises a diode-controlled phase-change random access memory (PRAM) cell.

* * * * *